United States Patent
Braun et al.

(12)

(10) Patent No.: US 6,822,468 B2
(45) Date of Patent: Nov. 23, 2004

(54) METHOD AND APPARATUS FOR IMPLEMENTING PRINTED CIRCUIT BOARD HIGH POTENTIAL TESTING TO IDENTIFY LATENT DEFECTS

(75) Inventors: David J. Braun, St. Charles, MN (US); Erica Elizabeth Jasper, Rochester, MN (US); Roger Scott Krabbenhoft, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/393,188

(22) Filed: Mar. 20, 2003

(65) Prior Publication Data

US 2004/0183524 A1 Sep. 23, 2004

(51) Int. Cl.[7] ................................................ G01R 31/28
(52) U.S. Cl. ...................... 324/763; 324/765; 324/754; 324/158.1
(58) Field of Search .................................. 324/765, 754, 324/158.1, 755, 763, 769, 758; 714/723, 724, 742; 327/105

(56) References Cited

U.S. PATENT DOCUMENTS

| | | | | |
|---|---|---|---|---|
| 3,970,934 A | * | 7/1976 | Aksu | 324/754 |
| 6,091,253 A | * | 7/2000 | Huang | 324/758 |
| 6,130,547 A | * | 10/2000 | Kato | 324/761 |

* cited by examiner

Primary Examiner—David Zarneke
Assistant Examiner—Jimmy Nguyen
(74) Attorney, Agent, or Firm—Joan Pennington

(57) ABSTRACT

A method and apparatus are provided for implementing finished printed circuit board high potential testing to identify latent defects. A printed circuit board to be tested includes adjacent surface features having opposing applied voltages. An electrically non-conductive material is disposed between at least some of said adjacent surface features. A predefined voltage potential is applied between predefined power connections of the printed circuit board to identify the latent defects. The electrically non-conductive material prevents surface arcing between the adjacent surface features at the applied predefined voltage potential.

20 Claims, 3 Drawing Sheets

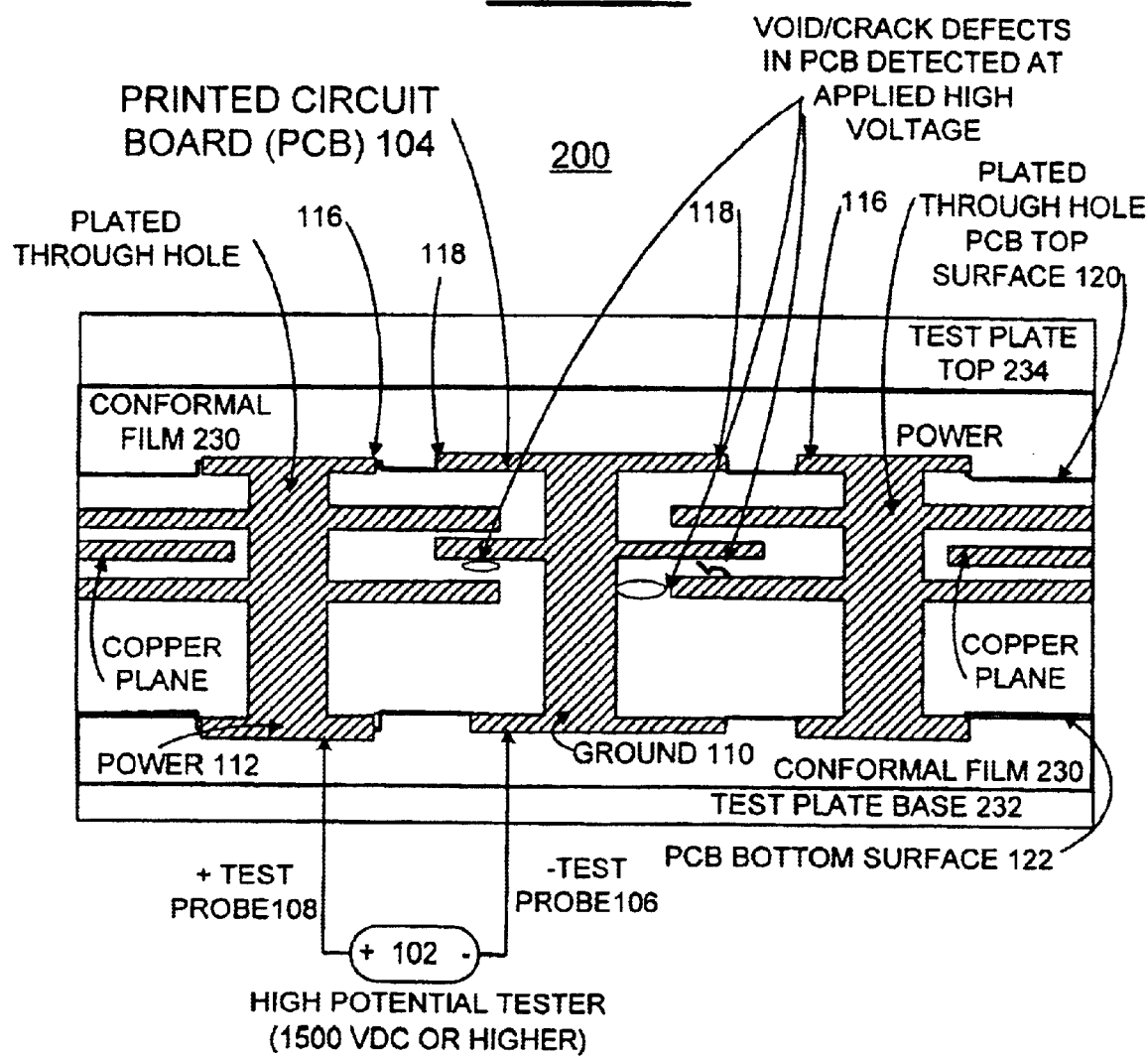

METHOD AND APPARATUS FOR IMPLEMENTING PRINTED CIRCUIT BOARD HIGH POTENTIAL TESTING TO IDENTIFY LATENT DEFECTS

FIELD OF THE INVENTION

The present invention relates generally to testing of printed circuit boards, and more particularly, relates to a method and apparatus for implementing finished printed circuit board high potential testing to identify latent defects.

DESCRIPTION OF THE RELATED ART

Current and future high performance computer systems and server systems rely on both large scale packaging of multiple high density interconnect modules and printed circuit boards (PCBS).

Printed circuit boards (PCBs) are constructed through the use of fibrous glass cloth and resin systems, along with copper foils. This construction has an inherent risk associated with the bonding of the resin system to the glass fiber as well as the ability for the resin to adequately fill areas where copper is etched away by design. If insufficient bonding or fill has taken place during the lamination processes, a path for future ionic and/or copper growth exists. This may at some point result in latent failure in the customer environment.

FIG. 1 illustrates a conventional printed circuit board (PCB) in a cross sectional view not to scale. As shown in FIG. 1, multiple plated through holes are provided for implementing connections for power and ground planes. Multiple adjacent opposing voltage surface features are disposed on the PCB top and bottom surfaces. Defects including voids and a crack are shown in FIG. 1 that can result in paths for future ionic and/or copper growth.

Conventionally finished PCB high potential testing typically is limited in the maximum applied voltage by the proximity of the surface features. The closer the surface features, the easier for surface arcing to occur, resulting in false failure. Surface arcing between adjacent opposing voltage surface features results, for example, with an applied test voltage above approximately 500 volts direct current (DC). Latent defects, such as the illustrated void and crack defects, are not detected when limiting the finished PCB testing to less than 500 VDC being applied.

A need exists for an improved mechanism for implementing the testing of finished printed circuit boards. It is desirable to perform testing of finished printed circuit boards to identify latent defects.

SUMMARY OF THE INVENTION

A principal object of the present invention is to provide a method and apparatus for implementing finished printed circuit board high potential testing to identify latent defects. Other important objects of the present invention are to provide such method and apparatus for implementing finished printed circuit board high potential testing to identify latent defects substantially without negative effect and that overcome many of the disadvantages of prior art arrangements.

In brief, a method and apparatus are provided for implementing finished printed circuit board high potential testing to identify latent defects. A printed circuit board to be tested includes adjacent surface features having opposing applied voltages. An electrically non-conductive material is disposed between at least some of said adjacent surface features. A predefined voltage potential is applied between predefined power connections of the printed circuit board to identify the latent defects. The electrically non-conductive material prevents surface arcing between the adjacent surface features at the applied predefined voltage potential.

In accordance with features of the invention, the applied predefined voltage potential for finished printed circuit board testing is, for example, 1500 VDC or higher and surface arcing is avoided.

BRIEF DESCRIPTION OF THE DRAWINGS

The present invention together with the above and other objects and advantages may best be understood from the following detailed description of the preferred embodiments of the invention illustrated in the drawings, wherein:

FIG. 3 is a block and schematic diagram representation illustrating an alternative testing system in accordance with the preferred embodiment.

DETAILED DESCRIPTION OF THE PREFERRED EMBODIMENTS

Figure 2:
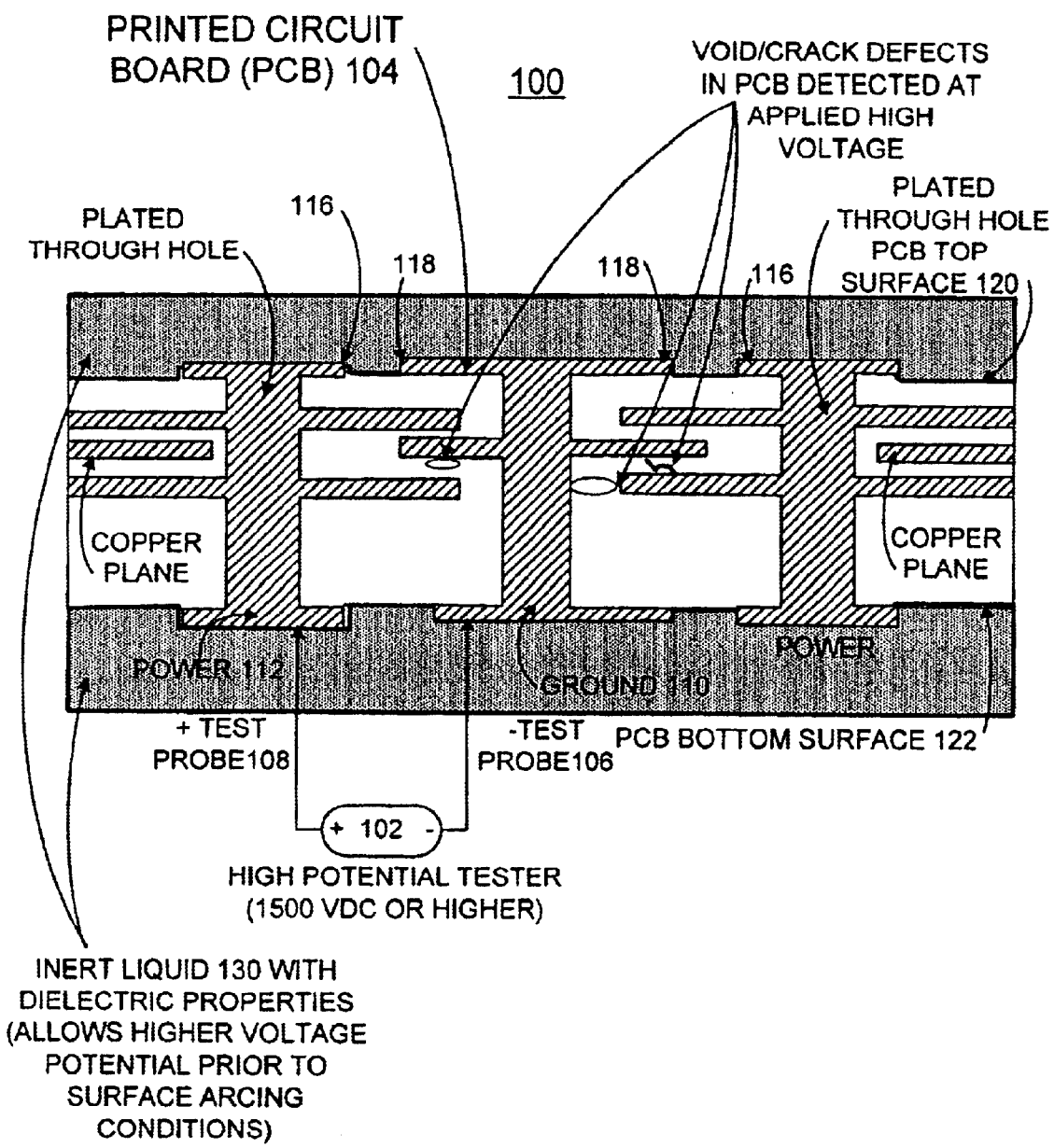
FIG. 2 is a block and schematic diagram representation illustrating a testing system in accordance with the preferred embodiment.

Having reference now to the drawings, in FIG. 2, there is shown a high potential testing system generally designated by the reference character 100 for implementing high potential printed circuit board (PCB) testing in accordance with the preferred embodiment. System 100 includes a high potential tester 102 coupled to predefined power connections of a potential printed circuit board (PCB) 104 to be tested.

As shown, the high potential tester 102 has a negative (−) test probe 106 and a positive (+) test probe 108 respectively coupled to a ground connection 110 and a power connection 112 near a bottom side 114 of PCB 104. During testing of the PCB 104, the negative (−) test probe 106 and the positive (+) test probe 108 are respectively coupled to selected alternate power connections of the PCB 104. For example, the negative (−) test probe 106 and the positive (+) test probe 108 are respectively coupled between ground and selected alternate power connections, such as 5 volts, 3 volts, and 1 volts; and between selected 5 volts, 3 volts, and 1 volts power connections. The PCB 104 includes a plurality of adjacent surface features 116, 118 having opposing applied voltages as shown on a PCB top surface 120 and on a PCB bottom surface 122.

Figure 1:
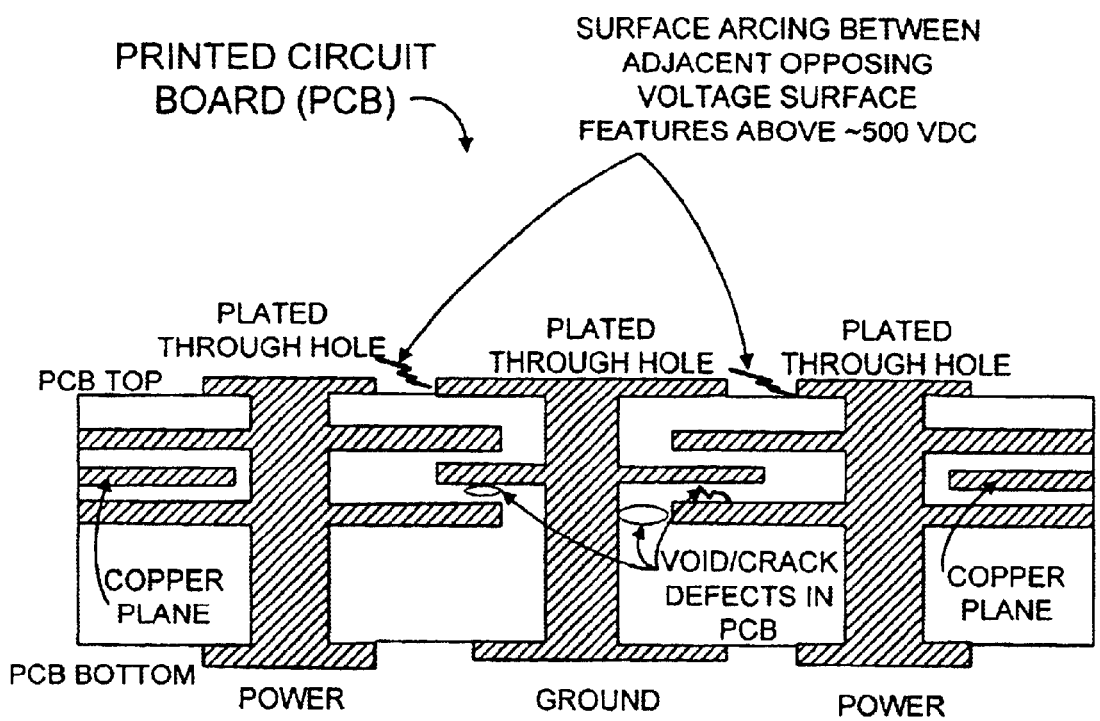
FIG. 1 is a block and schematic cross sectional representation illustrating a conventional printed circuit board (PCB)

In accordance with features of the preferred embodiments, an electrically non-conductive material is provided between adjacent surface features 116, 118 to prevent surface arcing between adjacent surface features at a predefined applied voltage potential adequate to detect latent defects, for example 1500 VDC or higher. In conventional applied voltage testing, application of such a high voltage potential adequate to detect latent defects, such as void and crack defects illustrated in FIGS. 1 and 2 cannot be used. An applied voltage greater than 500 VDC results in surface arcing between adjacent opposing voltage surface features in the conventional PCB as illustrated in FIG. 1.

In accordance with features of the preferred embodiments, this increased voltage application enables detecting finer defects which otherwise would put a PCB assembly at risk for potential latent failure or actual burn in the customer environment. Multiple instances of potential customer burns advantageously can be detected prior to shipment with this test methodology employed.

As shown in FIG. 2, the PCB 104 is immersed in an inert liquid 130 with dielectric properties that allow higher voltage potentials, for example, 1500 VDC or higher, to be applied by the high potential tester 102 that are adequate to detect potential latent defects.

The inert liquid 130 prevents surface arcing between the adjacent surface features 116, 118 that have opposing applied voltages. The inert liquid 130 includes fluorinated compounds having dielectric constants in a range for preventing surface arcing between the adjacent surface features 116, 118. The inert liquid 130 prevents surface arcing at applied predefined voltage potential in excess of 1500 VDC.

After performing the finished printed circuit board high potential testing, PCB 104 is removed from the inert liquid 130 and then any residual inert liquid is cleaned from the PCB. The inert liquid 130 does not affect the function of the PCB 104 once cleaned off.

Referring now to FIG. 3, there is shown an alternative high potential testing system generally designated by the reference character 200 for implementing high potential printed circuit board (PCB) testing in accordance with the preferred embodiment. System 200 similarly includes a high potential tester 102 coupled to a potential printed circuit board (PCB) 104 to be tested.

As shown in FIG. 3, the high potential tester 102 has a negative (−) test probe 106 and a positive (+) test probe 108 respectively coupled to a ground connection 110 and a power connection 112 near a bottom side 114 of PCB 104. The PCB 104 includes a plurality of adjacent surface features 116, 118 having opposing applied voltages as shown on a PCB top surface 120 and on a PCB bottom surface 122.

In system 200, an electrically non-conductive conformal film 230 is used instead of the inert liquid 130 of system 100 in FIG. 2. A first conformal coating 230, for example. Is mounted to a test plate base 232 disposed below the PCB bottom surface 122 and a second conformal coating 230 is mounted to a test plate top 234 disposed above the PCB top surface 120. During testing, the PCB 104 is pressed between the test plate base 232 and the test plate top 234 so that the respective first conformal film and second conformal film 230 is disposed between at least some of the adjacent surface features 116, 118 on the PCB bottom surface 122 and the PCB top surface 120.

The conformal coating 230 substantially fills in the air gap, either completely or partially, between the proximate features 116, 118 of the PCB 104, thus increasing the maximum applied voltage as the conformal coating 230 inhibits surface arcing across the air gap between the adjacent opposing voltage features.

The conformal film 230 is applied either to the entire board surfaces 120, 122, or at least to those PCB surface areas having adjacent surface features 116, 118 of closest proximity, to allow a higher voltage application adequate to detect potential latent defects, for example, 1500 VDC or higher.

The conformal film 230 alternatively can be either sprayed on, brushed on, or applied as a tape which, when applied to PCB surfaces 120, 122 fills in the air gap, either completely or partially, between the proximate features 116, 118. This similarly results in finer defects being located, reducing the chance of a latent defect being first detected in the use of PCB 104.

After performing the finished printed circuit board high potential testing, conformal film 230 is removed from the PCB 104.

While the present invention has been described with reference to the details of the embodiments of the invention shown in the drawing, these details are not intended to limit the scope of the invention as claimed in the appended claims.

What is claimed is:

1. Apparatus for implementing finished printed circuit board high potential testing to identify latent defects comprising:

a printed circuit board to be tested; said printed circuit board including adjacent surface features having opposing applied voltages;

an electrically non-conductive material disposed between at least some of said adjacent surface features;

a high potential tester coupled to said printed circuit board for applying a predefined voltage potential between predefined power connections of said printed circuit board to identify the latent defects; and said electrically non-conductive material preventing surface arcing between said adjacent surface features at said applied predefined voltage potential.

2. Apparatus for implementing finished printed circuit board high potential testing as recited in claim 1 wherein said electrically non-conductive material includes a conformal film applied to a predefined surface portion of said printed circuit board.

3. Apparatus for implementing finished printed circuit board high potential testing as recited in claim 1 wherein said electrically non-conductive material includes a conformal film applied to substantially an entire surface of said printed circuit board.

4. Apparatus for implementing finished printed circuit board high potential testing as recited in claim 1 wherein said electrically non-conductive material includes a conformal film.

5. Apparatus for implementing finished printed circuit board high potential testing as recited in claim 4 wherein said conformal film is applied as a tape between at least some of said adjacent surface features.

6. Apparatus for implementing finished printed circuit board high potential testing as recited in claim 4 wherein said conformal film is sprayed on between at least some of said adjacent surface features.

7. Apparatus for implementing finished printed circuit board high potential testing as recited in claim 4 wherein said conformal film is brushed on between at least some of said adjacent surface features.

8. Apparatus for implementing finished printed circuit board high potential testing as recited in claim 4 wherein said conformal film includes a first conformal film mounted to a test plate base and a second conformal film mounted to a test plate top and said printed circuit board to be tested is pressed between said conformal films to provide said conformal films between at least some of said adjacent surface features.

9. Apparatus for implementing finished printed circuit board high potential testing as recited in claim 1 wherein said electrically non-conductive material includes a liquid and said printed circuit board to be tested is disposed in said liquid.

10. Apparatus for implementing finished printed circuit board high potential testing as recited in claim 1 wherein said liquid includes fluorinated compounds having dielectric constants in a range for preventing surface arcing between said adjacent surface features at said applied predefined voltage potential.

11. Apparatus for implementing finished printed circuit board high potential testing as recited in claim 1 wherein said applied predefined voltage potential is a direct current (DC) potential of 1500 Volts or greater.

12. Apparatus for implementing finished printed circuit board high potential testing as recited in claim 1 wherein said electrically non-conductive material disposed between at least some of said adjacent surface features is removed from said printed circuit board after testing.

13. A method for implementing finished printed circuit board high potential testing to identify latent defects comprising the steps of:

providing an electrically non-conductive material disposed between at least some of adjacent surface features having opposing applied voltages of a printed circuit board to be tested;

applying a predefined voltage between predefined power connections of said printed circuit board to identify the latent defects; and said electrically non-conductive material preventing surface arcing between said adjacent surface features at said applied predefined voltage potential.

14. A method for implementing finished printed circuit board high potential testing as recited in claim 13 wherein said step of providing said electrically non-conductive material disposed between at least some of adjacent surface features includes the step of applying a conformal film as a tape between at least some of said adjacent surface features.

15. A method for implementing finished printed circuit board high potential testing as recited in claim 13 wherein said step of providing said electrically non-conductive material disposed between at least some of adjacent surface features includes the step of spraying on a conformal film between at least some of said adjacent surface features.

16. A method for implementing finished printed circuit board high potential testing as recited in claim 13 wherein said step of providing said electrically non-conductive material disposed between at least some of adjacent surface features includes the step of brushing on a conformal film between at least some of said adjacent surface features.

17. A method for implementing finished printed circuit board high potential testing as recited in claim 13 wherein said step of providing said electrically non-conductive material disposed between at least some of adjacent surface features includes the step of pressing a conformal film between at least some of said adjacent surface features.

18. A method for implementing finished printed circuit board high potential testing as recited in claim 13 wherein said step of providing said electrically non-conductive material disposed between at least some of adjacent surface features includes the step of disposing said printed circuit board in a liquid; said liquid including fluorinated compounds having dielectric constants in a range for preventing surface arcing between said adjacent surface features at said applied predefined voltage potential.

19. A method for implementing finished printed circuit board high potential testing as recited in claim 13 further includes the step of removing said electrically non-conductive material from said printed circuit board after testing.

20. A method for implementing finished printed circuit board high potential testing as recited in claim 13 wherein said step of applying said predefined voltage potential includes the step of applying a direct current (DC) potential of 1500 Volts or greater.

* * * * *